(12) United States Patent
Chen et al.

(10) Patent No.: US 10,276,747 B2
(45) Date of Patent: Apr. 30, 2019

(54) SUBSTRATE WAFER AND MANUFACTURING METHOD OF A III-NITRIDE SEMICONDUCTOR DEVICE

(71) Applicant: EPISTAR CORPORATION, Hsinchu (TW)

(72) Inventors: Kai Shen Chen, Hsinchu (TW); Hsin Hsiung Huang, Hsinchu (TW); Wan Jung Lee, Hsinchu (TW); Pei Chia Chen, Hsinchu (TW); Yung Hsin Tai, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/492,853

(22) Filed: Apr. 20, 2017

(65) Prior Publication Data

US 2017/0309783 A1 Oct. 26, 2017

(30) Foreign Application Priority Data

Apr. 20, 2016 (TW) .............................. 105112210 A

(51) Int. Cl.
| | |
|---|---|
| *H01L 33/16* | (2010.01) |
| *H01L 33/20* | (2010.01) |
| *H01L 27/15* | (2006.01) |
| *C30B 29/40* | (2006.01) |
| *C30B 25/18* | (2006.01) |
| *H01L 33/00* | (2010.01) |
| *H01L 33/32* | (2010.01) |

(52) U.S. Cl.
CPC .............. *H01L 33/16* (2013.01); *C30B 25/18* (2013.01); *C30B 29/403* (2013.01); *H01L 27/153* (2013.01); *H01L 33/007* (2013.01); *H01L 33/0095* (2013.01); *H01L 33/20* (2013.01); *H01L 33/32* (2013.01)

(58) Field of Classification Search
CPC ....... C30B 29/406; C30B 29/38; H01L 33/32; H01L 21/0242; H01L 21/0254
USPC .................................................. 257/76, 190
See application file for complete search history.

(56) References Cited

U.S. PATENT DOCUMENTS

2011/0275172 A1* 11/2011 Okabe ................. H01L 33/0095
438/33
2017/0327971 A1* 11/2017 Fujisawa .................. C30B 7/10

* cited by examiner

*Primary Examiner* — Jonathan Han
(74) *Attorney, Agent, or Firm* — Patterson + Sheridan, LLP

(57) ABSTRACT

A substrate wafer composed of a hexagonal single crystal material including a C crystalline plane, an A crystalline plane, and an M-axis direction includes a top surface is a C-axis plane; a first side connecting to the aforementioned top surface and being substantially a curve line viewing from the direction perpendicular to the aforementioned C crystalline plane and including a curvature center; and a second side connecting to the aforementioned first side; and wherein there is a line segment defined by a shortest distance between the aforementioned second side and the aforementioned curvature center, and the aforementioned line segment is not parallel with the aforementioned M-axis direction.

11 Claims, 7 Drawing Sheets

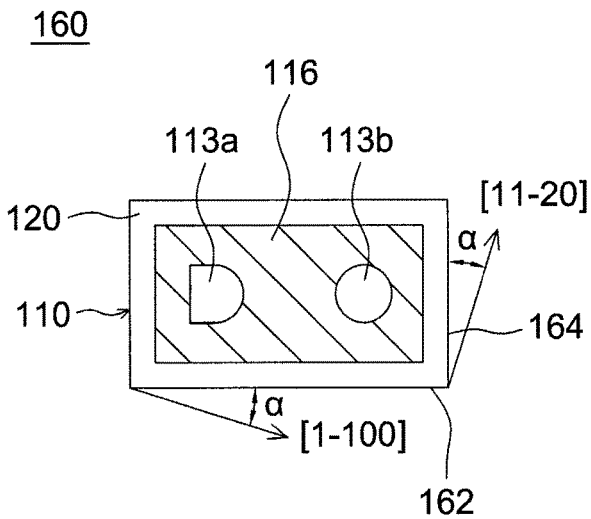
FIG. 5A
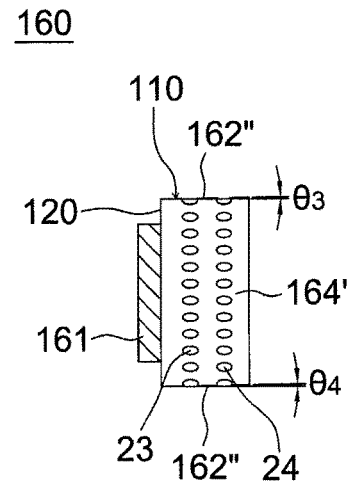
FIG. 5B
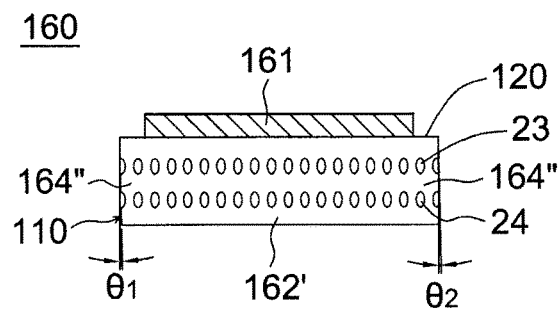
FIG. 5C
| included angle(α) | 5° | 15° | 30° | 45° |
|---|---|---|---|---|
| inclined angle of the short side surface (θ1 and θ2) | ±1° | ±1° | 5~8° | ±1° |
| inclined angle of the long side surface (θ3 and θ4) | 5~8° | ±1° | ±1° | ±1° |
FIG. 6

SUBSTRATE WAFER AND MANUFACTURING METHOD OF A III-NITRIDE SEMICONDUCTOR DEVICE

CROSS-REFERENCE TO RELATED APPLICATIONS

The present application is a non-provisional patent application, claiming the benefit of priority of TW Patent Application No. 105112210 filed on Apr. 20, 2016 which is incorporated herein by its entirety.

TECHNICAL FIELD

The present disclosure relates to a substrate wafer and a manufacturing method of a III-nitride, (i.e., Group III-nitride) semiconductor device, and in particular to a manufacturing method of a III-nitride semiconductor device by using the substrate wafer.

DESCRIPTION OF THE RELATED ART

Researches about the III-nitride semiconductor materials have been very extensive in recent decades. Nowadays, aluminum nitride (AlN), gallium nitride (GaN), indium nitride (InN), and the ternary alloy or the quaternary alloy which is synthesized by the aforementioned elements with adequate ratio are all popular materials.

According to the band gaps, high brightness blue and green light emitting diodes (LED) could be manufactured by using the gallium-nitride based compound materials through metal organic chemical vapour deposition method (MOCVD), hydride vapour phase epitaxy method (HYPE) and so on. Besides, the materials could also be applied to the manufacture of the blue and green laser diodes (LD). The materials could further be synthesized with other III-nitride materials with adequate ratio to form the ternary alloy or the quaternary alloy. Except for the aforementioned LED and LD, solar cell devices, photodetectors, and high power electronic devices such as high electron mobility transistors (HEMT) and rectifiers could be manufactured by taking advantage of the physical characteristics of the III-nitride semiconductor materials.

The probable manufacturing steps of the traditional III-nitride semiconductor devices are described in the following: First, a plurality of III-nitride semiconductor epitaxial layers is formed on a substrate wafer through the epitaxial manufacturing processes, and then, a plurality of III-nitride semiconductor units is formed by subsequent manufacturing processes according to the different needs of the different devices. Those processes can be forming trenches, forming insulating layers, forming electrodes, and so on. Then, a part of the III-nitride semiconductor epitaxial layers between each two of the III-nitride semiconductor units are removed by etching processes to form the cut streets which are used to separate the III-nitride semiconductor units. Finally, the plurality of III-nitride semiconductor units is separated into a plurality of III-nitride semiconductor devices by cutting and cleaving the substrate wafer along the cutting streets.

The method of cutting the substrate wafer generally includes the following steps: First, for the substrate to be cut, forming grooves or processing-modified layers as starting points by a scribe, a dicer, a laser or the like in advance. For example, a stealth dicing method collects laser light by an objective lens optical system and focuses irradiation in the interior of a substrate along predetermined cutting lines on the substrate to form the processing-modified layers having lower crystal strength. Then, a blade having an acute-angle tip is adjusted to contact and is pushed into the substrate wafer by an impactive force so the substrate wafer is separated into a plurality of III-nitride semiconductor devices.

When the material of the substrate wafer is hexagonal single crystal material such as sapphire or the like, even the interior of the substrate wafer is modified in advance by the stealth dicing method and then the substrate wafer is cut with an impactive force along the direction perpendicular to the surface thereof in order to divide the III-nitride semiconductor devices thereon, there is still a problem of the uncontrollable inclined-separating. That is, some side surfaces (cutting planes) of the III-nitride semiconductor devices are inclined, and the cutting planes are even extended to the interior of the III-nitride semiconductor devices that may cause damages of the III-nitride semiconductor devices. The detail is disclosed as follows:

FIG. 1 is a diagram illustrating the crystal orientation of a hexagonal single crystal system. In the hexagonal single crystal system, the upward bottom surface of a hexagonal column is a C crystalline plane (0001), and all the six side surfaces are an M crystalline plane (1-100) and planes equivalent to the M crystalline plane (the M crystalline plane family {1-100}, not shown in the diagram). Hereinafter, unless otherwise specified, the M crystalline plane and the planes equivalent to the M crystalline plane are collectively referred as the M crystalline plane. A direction perpendicular to the C crystalline plane (0001) is a [0001] direction (C-axis direction), and a direction perpendicular to the M crystalline plane (1-100) is a [1-100] direction (M-axis direction). Besides, in the hexagonal column structure, there are three axes, a1-axis, a2-axis, and a3-axis in the bottom surface, which are all perpendicular to the C-axis direction. Two points of a coordinate "1" in each of the a1-axis and the a2-axis are defined. A crystalline plane passing through the two points and being in parallel with the C-axis is an A crystalline plane (11-20). Herein, other five planes which are parallel with C-axis and equivalent to A crystalline plane (the A crystalline plane family {11-20}, not shown in the diagram) could be defined by other vertices of the top surface and the bottom surface of the hexagonal column by the similar method. Hereinafter, unless otherwise specified, the A crystalline plane and the planes equivalent to the A crystalline plane are collectively referred as the A crystalline plane. A direction perpendicular to A crystalline plane (11-20) is a [11-20] direction (A-axis direction).

As illustrated in FIG. 2A, a top view of an epitaxial wafer 100 before cutting and cleavage is disclosed. The epitaxial wafer 100 includes a substrate wafer 10 and a plurality of III-nitride light emitting diode units 40 formed on the top surface 20. During the semiconductor devices manufacturing processes, if we use the hexagonal single crystal system material such as sapphire as the substrate wafer 10, according to the property requirement of the target devices, the top C-axis plane is the top surface 20 of the substrate wafer. It is noteworthy here that considering the manufacturing ability and epitaxial quality, the phrase "C-axis plane" is defined by a plane having an off angle with C crystalline plane in the range between ±1 degree, including C crystalline plane itself. Besides, if we view from the direction perpendicular to the top surface 20 (vertical to the C-axis plane), the substrate wafer 10 further includes an orientation flat 30 which is used to define the crystal direction of the substrate wafer 10. As illustrated in FIG. 2A, the orientation flat 30 is parallel with A crystalline plane of the substrate wafer 10 (vertical to A-axis direction ([11-20] direction)). That is, A crystalline plane is parallel with M-axis direction. Besides, the plurality of III-nitride light emitting diode units 40 is defined by the cutting streets 50*a* and 50*b* which along the directions perpendicular to and parallel with the orientation flat 30.

Then, a plurality of III-nitride light emitting diode devices 60 with rectangular surface shapes is separated by cutting and cleavage the substrate wafer 10 according to the aforementioned cutting and cleavage processes along the cutting streets 50*a* parallel with A-axis direction ([11-20] direction) and the cutting streets 50*b* perpendicular to A-axis direction (parallel with A crystalline plane or M-axis direction ([1-100] direction)). FIG. 2B, FIG. 2C, and FIG. 2D illustrate the top view, the short-side view, and the long-side view of a III-nitride light emitting diode device 60 after cutting and cleavage, respectively.

FIGS. 2B~2D show the top views of a III-nitride light emitting diode device 60 including a III-nitride semiconductor epitaxial part 61, a first electrode 63, and a second electrode 65. Referring to FIG. 2C, when we view from the short-side view, the short sides 62″ of the long side surfaces 62′ of the III-nitride light emitting diode device 60 have inclined angles θ3 and θ4 corresponding to the normal direction of the top surface 20 (the inclined angles between the two long side surfaces 62′ and the direction vertical to the top surface 20, respectively). In the related art, the inclined angles θ3 and θ4 are smaller than 2 degrees and the cutting surfaces are almost perpendicular to the top surface 20 of the substrate. Referring to FIG. 2D, the short sides 64″ of the short side surfaces 64′ of the III-nitride light emitting diode device 60 have inclined angles θ1 and θ2 corresponding to the normal direction of the top surface 20 (the inclined angles between the two short side surfaces 64′ and the direction vertical to the top surface 20, respectively). In the related art, the inclined angles θ1 and θ2 are 5~8 degrees so the inclined angles between the two short side surfaces 64′ and the direction vertical to the top surface 20 are larger and not vertical to the top surface 20. When the inclined angles are too large, the positions to be cut and cleavage may be extended over the cutting streets (50*a*, 50*b*) to the III-nitride semiconductor epitaxial part 61. When the situation is more severe, the production yield of the III-nitride light emitting diode device 60 could be impacted. It is noteworthy that people with ordinary skill in the art may realize that the inclined angles between the two short-side faces and the normal direction of the top surface and the inclined angles between the two long-side faces and the normal direction of the top surface need not to be the same and therefore could be different.

SUMMARY OF THE DISCLOSURE

A substrate wafer composed of a hexagonal single crystal material including a C crystalline plane, an A crystalline plane, and an M-axis direction includes a top surface being a C-axis plane; a first side connecting to the aforementioned top surface and being substantially a curve line viewing from the direction perpendicular to the aforementioned C crystalline plane and including a curvature center; and a second side connecting to the aforementioned first side; and wherein there is a line segment defined by the shortest distance between the aforementioned second side and the aforementioned curvature center that is not perpendicular to the aforementioned M-axis direction.

A substrate wafer composed of a hexagonal single crystal material including a C crystalline plane, an A crystalline plane, and an M-axis direction, includes a top surface being a C-axis plane; a first side connecting to the aforementioned top surface and being substantially a curve line viewing from the direction perpendicular to the aforementioned C crystalline plane; and a second side connecting to the aforementioned first side and being substantially a straight line viewing from the direction perpendicular to the aforementioned C crystalline plane; and wherein the aforementioned second side is not parallel with the aforementioned M-axis direction.

A manufacturing method of a III-nitride semiconductor device including providing the aforementioned substrate wafer; forming a plurality of III-nitride semiconductor units on the aforementioned substrate wafer; and dividing the aforementioned plurality of III-nitride semiconductor units into a plurality of III-nitride semiconductor devices.

BRIEF DESCRIPTION OF THE DRAWINGS

FIG. 5A shows a diagram illustrating a top view of a III-nitride light emitting diode device cut and cleaved from the epitaxial wafer in accordance with an embodiment of the present disclosure.

FIG. 5B shows a diagram illustrating a short-side view of a III-nitride light emitting diode device cut and cleaved from the epitaxial wafer in accordance with an embodiment of the present disclosure.

FIG. 5C shows a diagram illustrating a long-side view of a III-nitride light emitting diode device cut and cleaved from the epitaxial wafer in accordance with an embodiment of the present disclosure.

FIG. 6 shows a relationship chart of the inclined angles θ1~θ4 between the sides of the III-nitride light emitting diode device and the normal direction of the top surface thereof after cut and cleaved by changing the included angle α between the orientation flat and A crystalline plane.

DETAILED DESCRIPTION OF THE EMBODIMENTS

Figure 1:
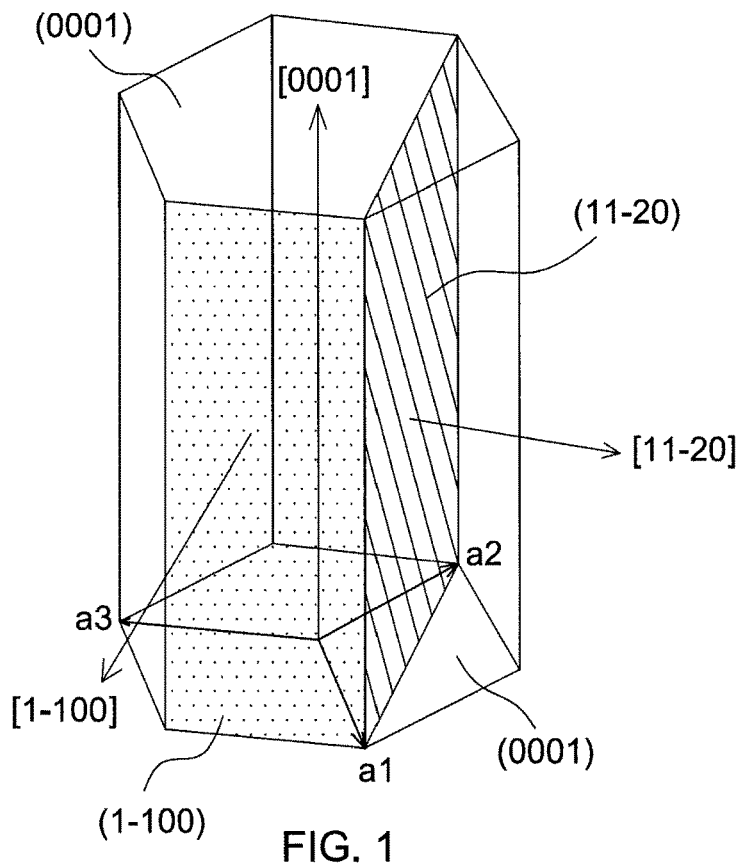
FIG. 1 shows a diagram illustrating the crystal orientation of a hexagonal single crystal system.
Figure 2A:
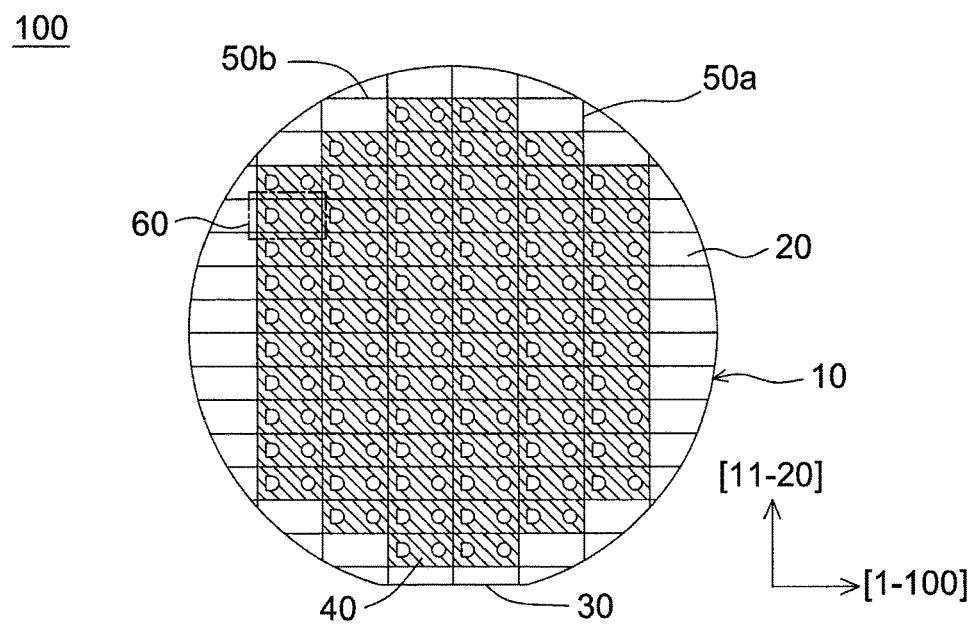
FIG. 2A shows a diagram illustrating a top view of the traditional III-nitride light emitting diodes epitaxial wafer.
Figure 2B:
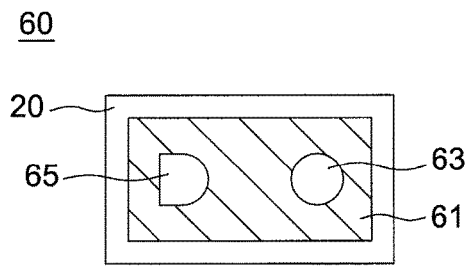
FIG. 2B shows a diagram illustrating a top view of a III-nitride light emitting diode device cut and cleaved from the traditional III-nitride light emitting diodes epitaxial wafer.
Figure 2C:
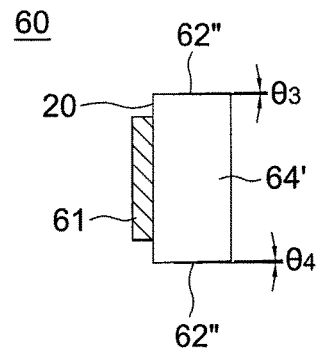
FIG. 2C shows a diagram illustrating a short-side view of a III-nitride light emitting diode device cut and cleaved from the traditional III-nitride light emitting diodes epitaxial wafer.
Figure 2D:
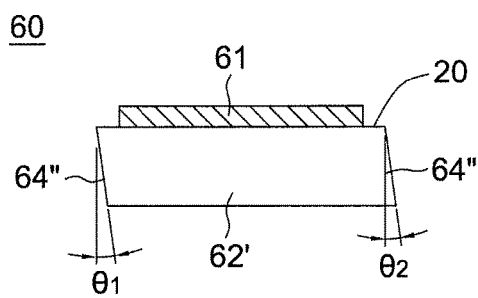
FIG. 2D shows a diagram illustrating a long-side view of a III-nitride light emitting diode device cut and cleaved from the traditional III-nitride light emitting diodes epitaxial wafer.
Figure 3A:
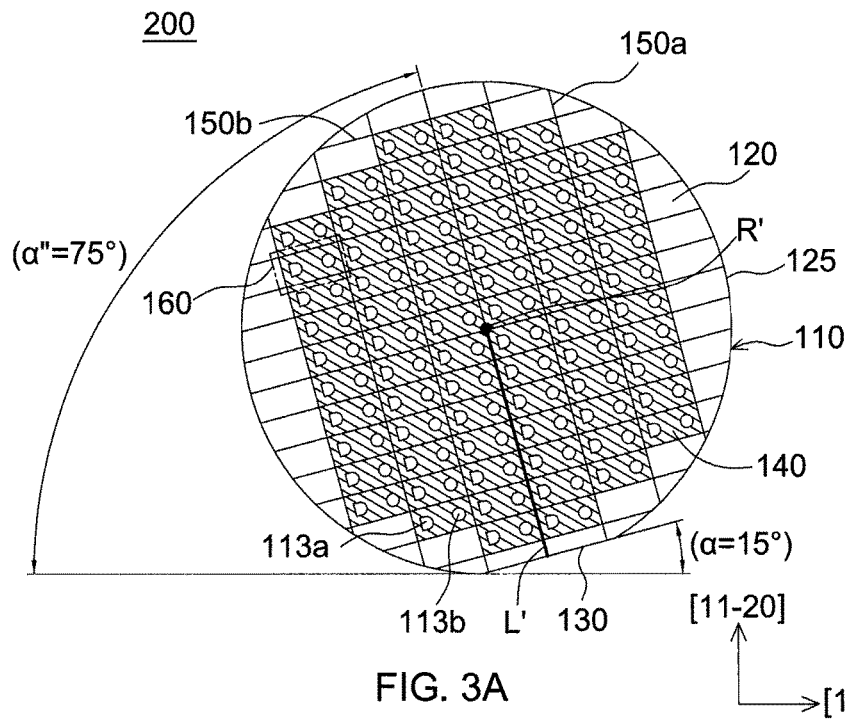
FIG. 3A shows a top view of a III-nitride light emitting diode device epitaxial wafer in accordance with an embodiment of the present disclosure.
Figure 3B:
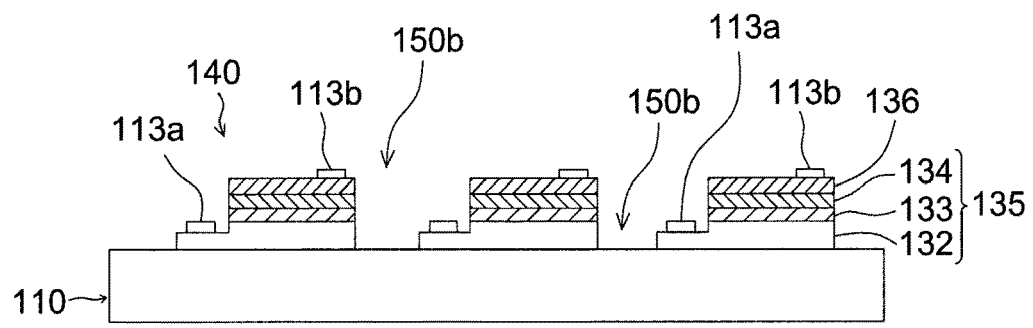
FIG. 3B shows a side view of a III-nitride light emitting diode device epitaxial wafer in accordance with an embodiment of the present disclosure.
Figure 3C:
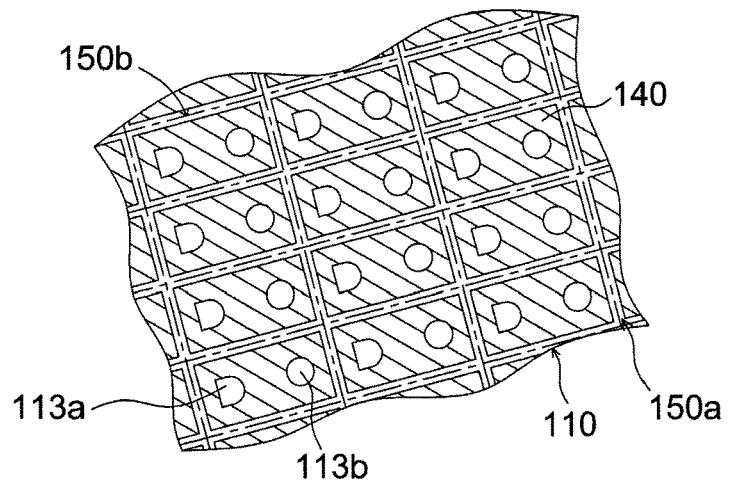
FIG. 3C shows a drawing of partial enlargement of a III-nitride light emitting diode device epitaxial wafer in accordance with an embodiment of the present disclosure.
Figure 3D:
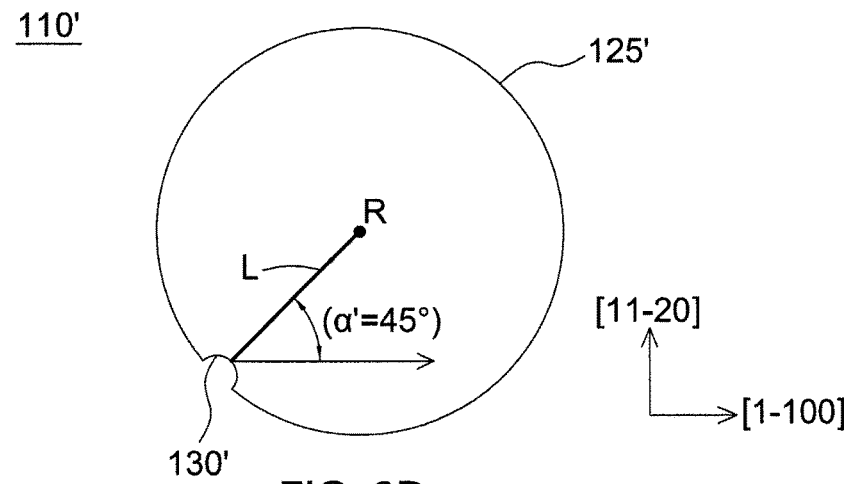
FIG. 3D shows a top view of a III-nitride semiconductor epitaxial wafer in accordance with an embodiment of the present disclosure.
Figure 4A:
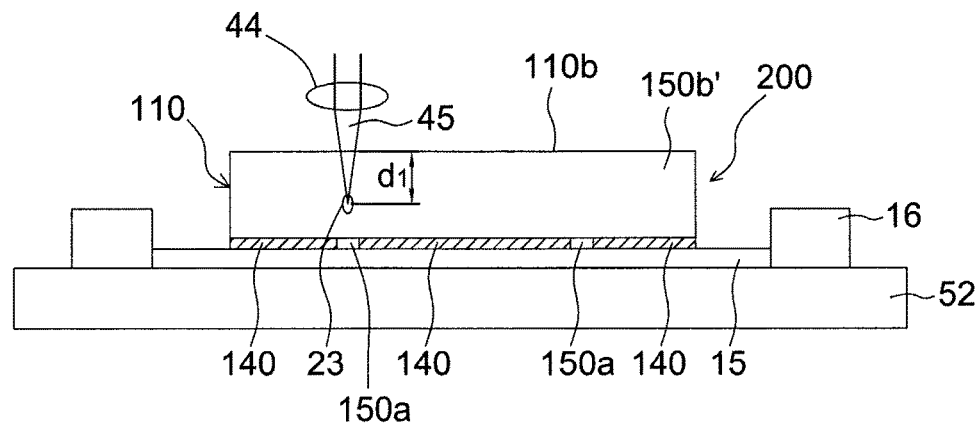
FIGS. 4A~4C show the perspective views of forming the processing-modified regions within an epitaxial wafer by the laser processing in accordance with an embodiment of the present disclosure.
Figure 4B:
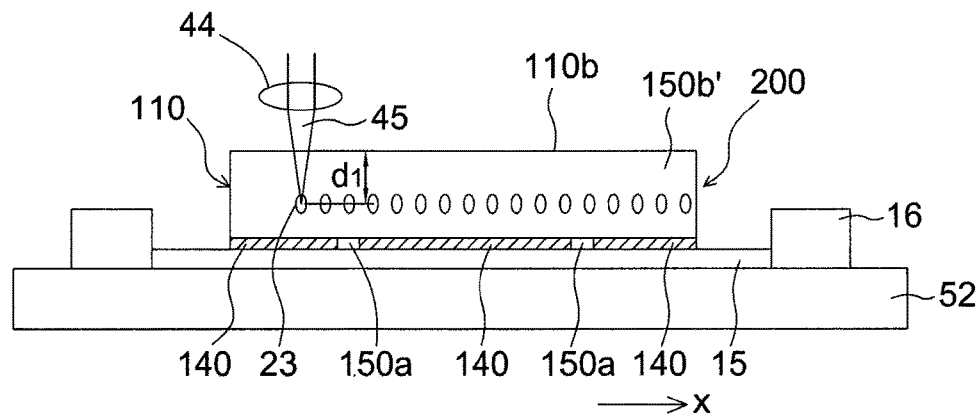
Figure 4C:
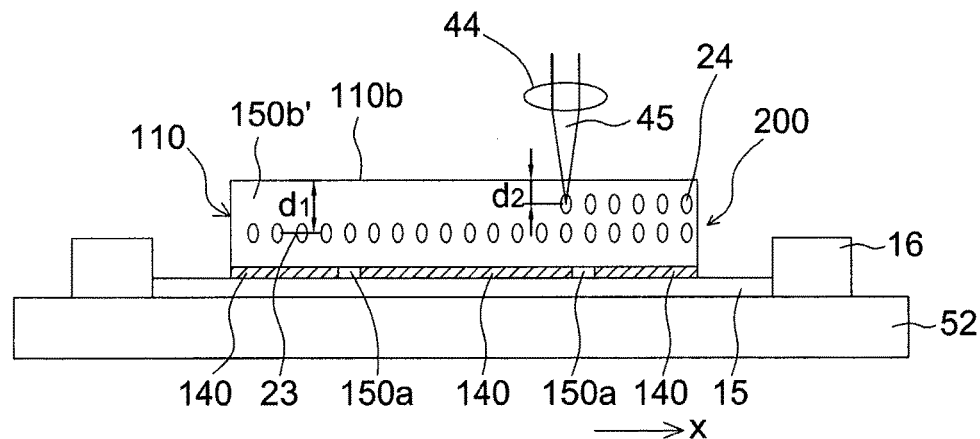

Referring to FIGS. 3A~3C, an epitaxial wafer with a plurality of III-nitride light emitting diode units in accordance with an embodiment of the present disclosure is disclosed. FIG. 3D discloses a top view of a III-nitride semiconductor epitaxial wafer in accordance with an embodiment of the present disclosure. FIGS. 4A~4C show the procedures of forming the processing-modified regions within the epitaxial wafer by the laser processing in accordance with an embodiment of the present disclosure. FIGS. 5A~5C show the views of a III-nitride light emitting diode device cut and cleaved from the epitaxial wafer in accordance with an embodiment of the present disclosure.

FIG. 3A discloses an embodiment of the present disclosure. A top view of an epitaxial wafer 200 structure with a plurality of III-nitride light emitting diode units 140. In the present embodiment, the substrate wafer 110 is composed of sapphire. As aforementioned, the hexagonal single crystal material itself comprises a plurality of C crystalline planes, a plurality of A crystalline planes, and M-axis directions parallel with the A crystalline planes. Referring to the top view, top surface 120 of the substrate wafer 110 is a C-axis plane. Besides, the substrate wafer 110 further comprises a first side 125 connecting to the top surface 120 and a second side 130 connecting to both the top surface 120 and the first side 125. In the disclosure, the C-axis plane could be substantially formed of C crystalline plane and a plane having an off angle with C crystalline plane in the range between ±1 degree is also included. In one embodiment of the present disclosure, the off angle is 0.2 degree. In the present embodiment, the first side 125 and the second side 130 define the top surface 120. The substrate wafer 110 further comprises a first side surface and a second side surface (not shown in the diagram) perpendicular to each other and connecting to the top surface 120 by the first side 125 and the second side 130 respectively. Herein, the second side 130 is substantially a straight line and an orientation flat for the subsequent manufacturing processes. In the present embodiment, the second side 130 has an included angle α with M-axis direction ([1-100] direction). In other words, when the second side surface including the second side 130 is perpendicular to the top surface 120, the second side surface also has an included angle α with A crystalline plane. In the present embodiment, the included angle α is 15 degrees. That is, as shown in FIG. 3A, the included angle α between the second side 130 and M-axis direction ([1-100] direction) is 15 degrees. It is noteworthy that people with ordinary skill in the art could realize the orientation structure of the substrate wafer 110 is not limited to a straight line. As shown in FIG. 3D, the substrate wafer 110' includes a curved first side 125' and a curved second side 130' which is used to be an orientation groove (notch). Meanwhile, no matter it is the straight second side 130 or the curved second side 130', there is always a line segment L' (or L) representing the shortest distance between the curvature center R' (or R) of the first side 125 (or 125') and the second side 130 (or 130'). Referring to FIG. 3D, during the orientation, according to the spirit of the disclosure, the line segment L can be disposed in the way having an extension direction with the included angle α' with M-axis direction ([1-100] direction), wherein the included angle is not equal to 90 degrees. That is, the direction of the line segment L is not perpendicular to M-axis direction. As shown in FIG. 3D, in the present embodiment, the included angle α' is 45 degrees. Similarly, referring to FIG. 3A, in the present embodiment, there is a line segment L' representing the shortest distance between the curvature center R' of the first side 125 and the second side 130. Also, line segment L' has an included angle α" with M-axis direction ([1-100] direction). In the present embodiment, the included angle α"=90°−α. In FIG. 3A, when the included angle α is 15 degrees, the included angle α" is 75 degrees.

The detailed manufacturing processes of the epitaxial wafer 200 are shown below. First, as shown in FIG. 3B, a III-nitride semiconductor epitaxial stack 135 constituted by a plurality of epitaxial layers is formed on the substrate wafer 110. The method of forming the III-nitride semiconductor epitaxial stack 135 could be proceeded by taking advantage of the buffer layer (not shown in the diagram) and the base layer (not shown in the diagram) formed on the buffer layer to be a growth base so that the III-nitride semiconductor epitaxial stack 135 can be formed with good crystallinity thereon and is not limited thereto. Herein, the III-nitride semiconductor epitaxial stack 135 which is needed to form the III-nitride light emitting diode devices 160 is disclosed to be a representative embodiment. The aforementioned buffer layer could be composed of the single crystal material(s) and/or the columnar crystal(s) of the III-nitride semiconductor material such as aluminum nitride (AlN), gallium nitride (GaN), and so on, and the buffer layer can be used to alleviate the lattice constant difference between the substrate 110 and the III-nitride semiconductor epitaxial stack 135. To form the buffer layer, a method such as MOCVD method (metalorganic chemical vapor deposition method), HYPE method (hydride vapor phase epitaxy method), MBE method (molecular beam epitaxy method), PVD method (physical vapor deposition method) can be used. The PVD method includes a sputtering method. Besides, the material(s) of the base layer and the material(s) of the buffer layer could be the same or different. For example, the base layer on the buffer layer could be made of III-nitride semiconductor materials. Depending on the requirement, the base layer could be doped by n-type impurity/impurities such as Si, Ge, and Sn. The base layer could also be an undoped III-nitride semiconductor material. The adjustment criterion of the dopant condition is not to impact the epitaxial quality and the crystallinity at the end.

As shown in FIG. 3B, the III-nitride semiconductor epitaxial stack 135 comprises an n-type layer 132, a light-emitting layer 133, and a p-type layer 134 while the n-type layer 132 is in contact with an n-type electrode 113a and the p-type layer 134 is in contact with a p-type electrode 113b. The n-type layer 132 usually includes an n-type contact layer (not shown in the diagram) and an n-type cladding layer (not shown in the diagram) or could include an n-type contact layer only. The material of the n-type contact layer is composed of $Al_xGa_{1-x}N$ layer ($0 \le x \le 1$, ideally $0 \le x \le 0.5$, more preferably $0 \le x \le 0.1$). Furthermore, in order to keep a good electrical contact with the n-type electrode 113a, the n-type contact layer could be doped with n-type impurities. The n-type impurities could be Si, Ge, Sn, and so on. Besides, if an n-type cladding layer is disposed between the n-type contact layer and the light-emitting layer 133, the n-type cladding layer can be made of AlGaN, GaN, GaInN, and the like. The energy band gap of the n-type cladding layer could be larger than the energy band gap of the light emitting layer.

The light-emitting layer 133 can be a single quantum well structure or a multiple quantum well structure. The single quantum well structure could be a III-nitride semiconductor layer made of $Ga_{1-y}In_yN$ ($0<y<0.4$). Besides, if the light-emitting layer 133 is a multiple quantum well structure, the aforementioned $Ga_{1-y}In_yN$ could be the well layer(s) and the barrier layer(s) could be composed of $Al_zIn_qGa_{1-z-q}N$ ($0\leq z<0.3$, $0\leq q<0.1$). The well layer(s) and the barrier layer(s) could be undoped or doped with impurities. The color of the irradiation of the light-emitting layer 133 could be green, blue, violet, or ultraviolet by adding the Al element therein.

The p-type layer 134 usually includes a p-type contact layer (not shown in the diagram) and a p-type cladding layer (not shown in the diagram) or could include only a p-type contact layer with the function of a p-type cladding layer. The p-type layer usually has a composition with a larger bang gap than that of the light-emitting layer 133. For example, the p-type cladding layer could be composed of $Al_xGa_{1-x}N$ ($0<x\leq 0.4$). In order to keep a good electrical contact with the p-type electrode 113b, the p-type contact layer is usually doped with p-type impurities. For example, the doping concentration is preferably $1\times 10^{18}$~$1\times 10^{21}$/cm³, and the concentration is more preferably $5\times 10^{19}$~$1\times 10^{20}$/cm³. The adjustment criteria for the dopant concentration are to keep good electrical contact, to prevent crack, and to keep good crystallinity. Herein, for example, the p-type impurities could be magnesium (Mg).

The method of forming the aforementioned III-nitride semiconductor epitaxial stack 135 on the substrate wafer 110 can be MOCVD method (metalorganic chemical vapor deposition method), HVPE method (hydride vapor phase epitaxy method), MBE method (molecular beam epitaxy method), PVD method (physical vapor deposition method), and so on. In the present embodiment, when MOCVD method is performed to form the III-nitride semiconductor epitaxial stack 135, hydrogen ($H_2$) or nitrogen ($N_2$) could be used as the carrier gas. Trimethyl gallium (TMG) or triethyl gallium (TEG) could be used as a Ga source for the group III element in the raw material. Trimethyl aluminum (TMA) or triethyl aluminum (TEA) could be used as an Al source for the group III element in the raw material. Trimethyl indium (TMI) or triethyl indium (TEI) could be used as an In source for the group III element in the raw material. Ammonia ($NH_3$) or diammonium ($N_2H_4$) and the like could be used as an N source for the group V element in the raw material. Furthermore, as the dopant, the n-type impurity can be Si with a source of silane ($SiH_4$) or disilane ($Si_2H_6$) or Ge with a source of organic germanium; the p-type impurity can be Mg with a source of biscyclopentadienyl magnesium ($Cp_2Mg$) or bisethylcyclopentadienyl magnesium ($(EtCp)_2Mg$).

After forming the III-nitride semiconductor epitaxial stack 135, a transparent conductive layer 136 could be selectively formed on the specific position of the p-type layer 134 of the III-nitride semiconductor epitaxial stack 135 by the photolithography technology and the lift-off technology. The material of the transparent conductive layer 136 could be a metal or a metal oxide. As a metal, the material could be gold (Au), nickle (Ni), and the alloy thereof. As a metal oxide, the material could be one of NiO, ZITO ($In_2O_3$—$SnO_2$), AZO(ZnO—$Al_2O_3$), IZO($In_2O_3$—ZnO), GZO(ZnO—$GeO_2$), and it is not limited thereto. As shown in FIG. 3B, finally, a p-type electrode 113b is formed on the specific position of the transparent conductive layer 136. The material of the p-type electrode 113b could be gold (Au), aluminum (Al), nickle (Ni), copper (Cu), and the alloy thereof, and it is not limited thereto.

Before or after forming the p-type electrode 113b, part of the III-nitride semiconductor epitaxial stack 135 could be selectively removed by the photolithography technology and the reactive ion etching technology (RIE) in order to form multiple first cutting streets 150a which are mutually parallel with each other and multiple second cutting streets 150b which are mutually parallel with each other. The first cutting streets 150a and the second cutting streets 150b are perpendicular to each other, and the locations of the adjacent III-nitride light emitting diode units 140 are defined thereof. Herein, the technology of forming the cutting streets 150a and 150b by removing a part of the III-nitride semiconductor epitaxial stack 135 could be the traditional technology such as laser method, diamond cutting method, and so on. Besides, when forming the cutting streets, some epitaxial layers (p-type layer 134 and light-emitting layer 133) located at the specific portion of the remaining III-nitride semiconductor epitaxial stack 135 could also be removed by the photolithography technology and the reactive ion etching technology (RIE) at the same time in order to expose the n-type layer 132. Finally, the n-type electrode 113a is formed by the photolithography technology in order to complete the structure as the side view is shown in FIG. 3B. The material of the n-type electrode 113a could be titanium (Ti), gold (Au), the alloy thereof, or the combination thereof, and it is not limited thereto. The sequence of aforementioned steps of forming cutting streets 150a, 150b and etching some specific portions in order to expose the n-type electrode 113a could be changed.

FIG. 3C is a drawing of partial enlargement of the top view shown in FIG. 3A. As shown in the diagram, the first cutting streets 150a and the second cutting streets 150b that divide the epitaxial wafer 200 into a plurality of III-nitride light emitting diode units 140 are perpendicular to and parallel with the second side, respectively. That is, they are arranged to be perpendicular to and parallel with a direction which has an included angle that is 15 degrees with A crystalline plane (M-axis direction ([1-100], and both are parallel)). Through the aforementioned cutting and cleavage methods, the epitaxial wafer 200 in the present embodiment with a plurality of III-nitride light emitting diode units 140 could be divided into a plurality of III-nitride light emitting diode devices 160.

In the present embodiment, the method of cutting substrate wafer is stealth dicing method using the irradiation of the laser light and the detail is explained in the following: As shown in FIGS. 4A and 4B, these are the perspective views of a side surface that is parallel with the direction of a second cutting street 150b (predetermined cutting plane 150b'). First, as shown in FIG. 4A, the epitaxial wafer 200 is bonded to the adhesive sheet 15 held by the metal ring 16 with the side having a plurality of III-nitride light emitting diode units 140 and cutting streets 150a thereon. Then, the whole structure is set on the adsorption stage 52. The procedure of the laser work after the epitaxial wafer 200 is set onto the adsorption stage 52 is explained in detail in the following: A laser light 45 irradiates through an optical system 44 into the epitaxial wafer 200 from the direction of the back surface 110b thereof and therefore the first processing-modified structures 23 are formed corresponding to the second cutting street 150b at the position in the epitaxial wafer 200 with a distance d1 from the back surface 110b. Then, as shown in FIG. 4B, via the pulse oscillation, the laser light 45 forms a plurality of the first processing-modified structures 23 in the substrate continuously along the extension direction corresponding to the second cutting street 150b and having a constant distance d1 from the back surface 110b of the epitaxial wafer 200 by repeatedly focusing and irradiation. The pulse oscillation frequency of the laser light 45 is, for example, 15000 Hz to 30000 Hz, the moving speed of the adsorptive stage 52 is 100 mm/sec to 500 mm/sec, and the output power of the laser is in a range of 1.5 µJ to 5.0 µJ. Besides, in addition to the aforementioned structure, a plurality of the second processing-modified structures 24 could also be formed along the direction of the cutting street 150b and the laser light 45 focuses on the points along the direction parallel with one cutting streets 150b (the position of the predetermined cutting plane 150b') in the substrate wafer 110 and having a distance d2 from the back surface 110b of the epitaxial wafer 200. That is, two sets of the first processing-modified structures 23 and the second processing-modified structures 24 are formed at interior of the predetermined cutting plane 150b' in the substrate wafer 110. The sequence of forming the first processing-modified structures 23 and the second processing-modified structures 24 could be changed. In another embodiment, by a multi-focus laser, the first processing-modified structures 23 and the second processing-modified structures 24 could be formed in the substrate wafer 110 simultaneously. The first processing-modified structures 23 and the second processing-modified structures 24 are the crack or molten structures formed by being irradiated by the highly focusing laser light 45. Compared with the range without being irradiated, the mechanical strength of the first processing-modified structures 23 or the second processing-modified structures 24 is lower. By repeating the aforementioned steps, after forming the first processing-modified structures 23 and the second processing-modified structures 24 along the direction of the second cutting street 150b, a plurality of the first processing-modified structures 23 and the second processing-modified structures 24 could also be formed along the direction of the first cutting street 150a (not shown in the diagram). After performing the laser irradiation procedures, a blade having an acute-angle tip end is adjusted to contact and is pushed into the substrate wafer 110 from the opposite side of the epitaxial wafer 200 (the top surface of the epitaxial wafer 200) at the position corresponding to the processing-modified structures therein, and the substrate wafer 110 is cleaved along the directions of the first cutting streets 150a and the second cutting streets 150b. By cutting, the substrate wafer 110 is cleaved and the plurality of III-nitride light emitting diode units 140 on the epitaxial wafer 200 is divided into a plurality of III-nitride light emitting diode devices 160. In another embodiment, after performing the laser irradiation, a blade having an acute-angle tip end is adjusted to contact and is pushed into the substrate wafer 110 from the back surface 110b of the epitaxial wafer 200 at the position corresponding to the processing-modified structures therein, and the substrate wafer 110 is cleaved along the directions of the first cutting streets 150a and the second cutting streets 150b.

FIGS. 5A-5C are the diagrams of a III-nitride light emitting diode device 160 cut and cleaved from the epitaxial wafer in accordance with an embodiment of the present disclosure. FIG. 5A, FIG. 5B, and FIG. 5C are the top view, the short-side view, and the long-side view of the III-nitride light emitting diode device 160, respectively.

Referring to the direction perpendicular to the top surface 120 of the substrate wafer as shown in FIG. 5B, the short-side view of the III-nitride light emitting diode device 160 reveals inclined angles θ3 and θ4 between the short sides 162" of a long side surface 162' and the normal direction of the top surface 120 (the inclined angles between the long side surface 162' and the direction perpendicular to the top surface 120). Similarly, as shown in FIG. 5C, there are inclined angles θ1 and θ2 between the short sides 164" of the short side surface 164' and the normal direction of the top surface 120 (the inclined angles between the short side surface 164" and the direction perpendicular to the top surface 120). Viewing from the direction perpendicular to the top surface 120, when the long side 162 of the III-nitride light emitting diode device 160 has an included angle of 15 degrees with M-axis direction ([1-100] direction) of the substrate wafer 110, that is, the short side 164" of the III-nitride light emitting diode device 160 has an included angle of 15 degrees with A-axis direction ([11-20] direction) of the substrate wafer 110, the inclined angles θ1 and θ2 of the short side surface 164' and the inclined angles θ3 and θ4 of the long side surface 162' are all below 2 degrees after cutting and cleavage. In other words, with respect to the top surface 120, the short side surface 164' and the long side surface 162' are the cutting surfaces that are almost perpendicular to the top surface 120. Therefore, by taking advantage of the embodiments of the present disclosure, the problem of the cutting plane extending over the cutting streets (150a and 150b) to the III-nitride semiconductor epitaxial part 161 as aforementioned can be avoided, and the production yield could be stabilized.

FIG. 6 shows the result of cutting and cleavage with different included angles α. Referring to FIG. 6, when the included angle α between the second side 130 of the substrate wafer 110 and the M-axis direction ([1-100] direction) varies, the inclined angles (θ1~θ2) between the short side surfaces 164' and the normal direction of the top surface 120 and the inclined angles (θ3~θ4) between the long side surfaces 162' of the III-nitride light emitting diode device 160 and the normal direction of the top surface 120 could be reduced. In the present embodiment, the inclined angles are below 2 degrees and the good production yield could be achieved. According to FIG. 6, the smaller inclined angles could be achieved when the included angles equal to 15 degrees and 45 degrees. Under these two situations, the inclined angles θ1~θ4 could be controlled to below 1 degree. Besides, based on the experiment results (not shown in the diagram), when the included angle α is controlled to be 5~20 degrees or 40~50 degrees, the inclined angles θ1~θ4 could meet the requirement of below 2 degrees.

When manufacturing the III-nitride light emitting diode devices, in addition to using a substrate wafer in accordance with the spirit of the disclosure, in order to enhance the total light emitting efficiency, a plurality of protruding structures can be formed by etching the top surface of the substrate wafer.

Figure 7A:
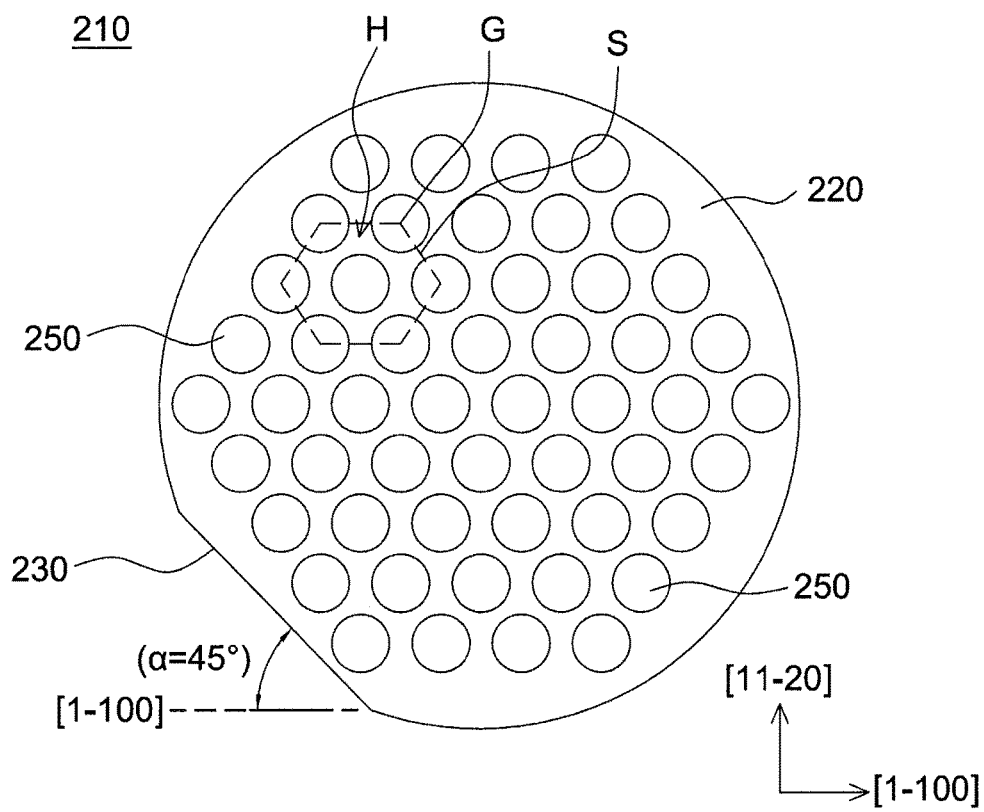
FIG. 7A shows a top view of a substrate wafer with protruding structures in accordance with an embodiment of the present disclosure.

As shown in FIG. 7A, it discloses a top view of a substrate wafer 210 in accordance with an embodiment of the present disclosure. In the embodiment, the second side 230 of the substrate wafer 210 has an included angle α equals to 45 degrees with M-axis direction ([1-100] direction). Viewing from the direction perpendicular to the top surface 220 of the substrate wafer 210 (for example, the top surface 220 is a C-axis plane composed of C crystalline plane), there are a plurality of protruding structures 250 arranged alternately and regularly on the top surface 220 of the substrate wafer 210. From the top view, because the substrate wafer 210 composed of sapphire is transparent, the protruding structure 250 with an exterior contour connecting to the top surface 220 of the substrate wafer 210 can been seen. In the present embodiment, the exterior contour is a circle. It is noteworthy that for the person with ordinary skill in the art, the exterior contour is not limited to a circle and could also be a square, a regular polygon, an ellipse, and so on. In the present embodiment, when the geometric centers G of six of the protruding structures 250 (the center of the circle in the embodiment) are connected, because the protruding structures 250 are arranged regularly with the same distance with each other, an imaginary regular hexagon H having six sides S can be formed. Besides, because the arrangement of the protruding structures 250 is for the subsequent III-nitride light emitting diode devices to be disposed thereon, the protruding structures 250 are arranged to be parallel with A crystalline plane (M-axis direction ([1-100] direction)). In addition, no matter in the embodiment as shown in FIG. 3 (the included angle is 45 degrees) or in other embodiments in accordance with the spirit of the present disclosure (the included angle is 5~20 degrees or 40~50 degrees), all the six sides S of the imaginary regular hexagon H are not parallel or perpendicular with the second side 230.

Figure 7B:
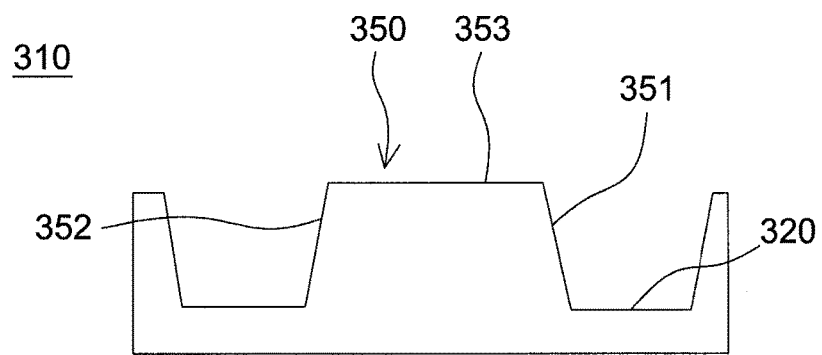
FIGS. 7B-7D show partial side views of the substrate wafers in accordance with three different protruding structures of the present disclosure.
Figure 7C:
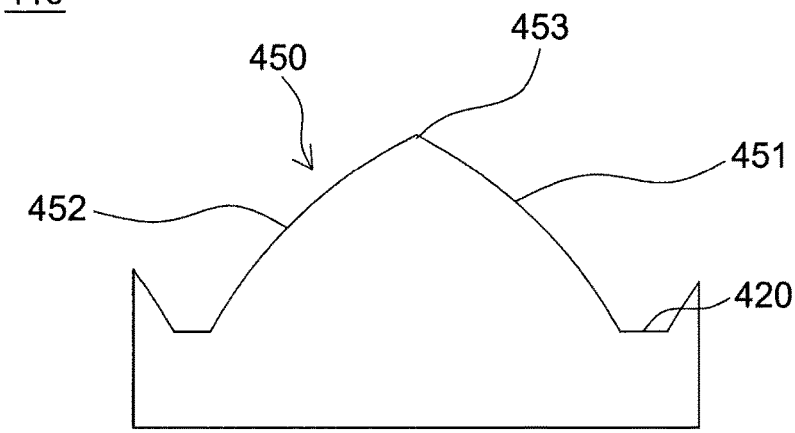
Figure 7D:
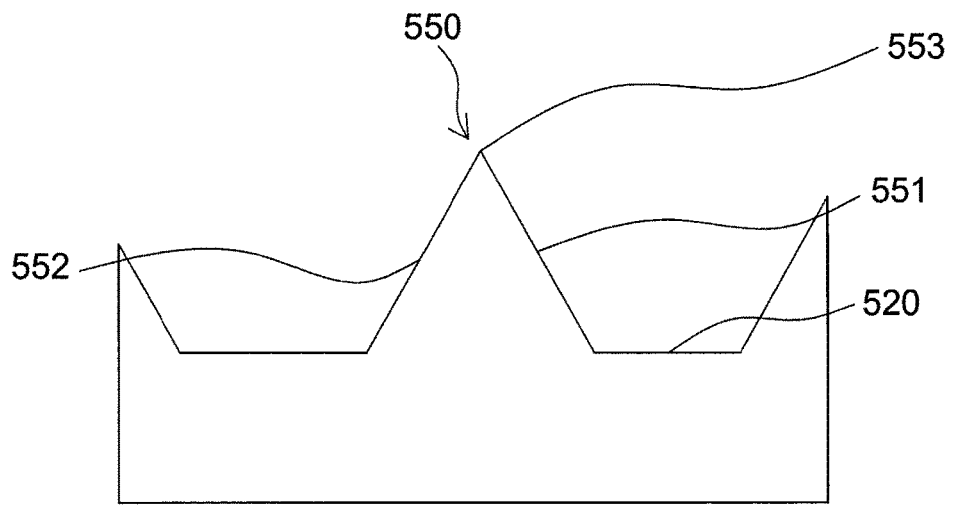

As shown in FIGS. 7B~7D, there are three partial side views of the substrate wafers in accordance with the embodiments with different protruding structures 350, 450, 550. As shown in FIG. 7B, the protruding structure 350 is protruding from the top surface 320 of the substrate wafer 310. The people with ordinary skill in the art could realize that in accordance with the requirement of the subsequent manufacturing procedure, the top surface 320 could also be a C-axis plane, and it is not limited thereto. Besides, in the diagram, the side view of the protruding structure 350 is a trapezoid which has two inclined sides 351, 352 and a nearly flat top side 353. In another embodiment, as shown in FIG. 7C, the protruding structure 450 is protruding from the top surface 420 of the substrate wafer 410. Besides, in the diagram, the side view of the protruding structure 450 is a tent-like shape which has two convex curved sides 451, 452 and a top endpoint 453. As shown in FIG. 7D, the protruding structure 550 is protruding from the top surface 520 of the substrate wafer 510. Besides, in the diagram, the side view of the protruding structure 550 is a triangle which has two straight sides 551, 552 and a top endpoint 553.

When cutting and cleaving the III-nitride semiconductor devices by the processes disclosed in the embodiments of the present disclosure, the problem caused by separation aforementioned could be suppressed and the production yield could be raised. The embodiments make the people with ordinary skill in the art to realize the contents of the present disclosure and enable the people with ordinary skill in the art in the field to practice. The embodiments could not be the limitation of the patent scope. Any equivalent change and modification in accordance with the spirit of the present disclosure are also covered in the scope of the disclosure.

What is claimed is:

1. A substrate wafer composed of a hexagonal single crystal material comprising a C crystalline plane, an A crystalline plane, and an M-axis direction, comprising:
   a top surface being a C-axis plane;
   a first side connecting to the top surface and being substantially a curve line viewing from the direction perpendicular to the C crystalline plane; and
   a second side connecting to the first side and being substantially a straight line viewing from the direction perpendicular to the C crystalline plane;
   wherein the second side is not parallel with the M-axis direction, wherein the hexagonal single crystal material is devoid of GaN material.

2. An epitaxial wafer, comprising:
   a substrate wafer according to claim 1; and
   a plurality of III-nitride light emitting diode units disposed on the top surface.

3. The substrate wafer according to claim 1, further comprising an included angle which is 5~20 degrees or 40~50 degrees between the second side and the M-axis direction.

4. The epitaxial wafer according to claim 2, further comprising an included angle which is 5~20 degrees or 40~50 degrees between the second side and the M-axis direction.

5. The substrate wafer according to claim 1, wherein the top surface further comprises a plurality of regularly arranged protruding structures.

6. The epitaxial wafer according to claim 2, wherein the top surface further comprises a plurality of regularly arranged protruding structures.

7. The substrate wafer according to claim 5, wherein, when viewing from a direction perpendicular to C crystalline plane, each of any six of the plurality of regularly arranged protruding structures further comprises an exterior contour, each of the exterior contour comprises a geometric center respectively, an imaginary regular hexagon is constituted by connecting the six geometric centers, and each side of the imaginary hexagon is neither parallel with nor perpendicular to the second side.

8. The epitaxial wafer according to claim 6, wherein, when viewing from a direction perpendicular to C crystalline plane, each of any six of the plurality of regularly arranged protruding structures further comprises an exterior contour, each of the exterior contour comprises a geometric center respectively, an imaginary regular hexagon is constituted by connecting the six geometric centers, and each side of the imaginary hexagon is neither parallel with nor perpendicular to the second side.

9. The epitaxial wafer according to claim 2, further comprising a plurality of first-direction cutting streets parallel with each other III-nitride, and wherein the first-direction cutting streets are parallel with the first side.

10. The substrate wafer according to claim 1, wherein the hexagonal single crystal material comprises sapphire.

11. An epitaxial wafer, comprising:
    a substrate composed of a hexagonal single crystal material comprising a C crystalline plane, an A crystalline plane, and an M-axis direction, comprising:
    a top surface being a C-axis plane;
    a first side connecting to the top surface and being substantially a curve line viewing from the direction perpendicular to the C crystalline plane; and
    a second side connecting to the first side and being substantially a straight line viewing from the direction perpendicular to the C crystalline plane, wherein the second side is not parallel with the M-axis direction; and a light emitting diode unit disposed on the top surface, comprising an n-type layer, a light-emitting layer, and a p-type layer, wherein the n-type layer, the light-emitting layer and the p-type layer comprises respectively III-nitride material; wherein the hexagonal single crystal material of the substrate wafer is different from the III-nitride material.

* * * * *